US012616054B2

(12) United States Patent
Raphoz et al.

(10) Patent No.: US 12,616,054 B2
(45) Date of Patent: Apr. 28, 2026

(54) HALF-BURIED ELECTRICAL CONNECTION INSERT ROD DEVICE

(71) Applicant: COMMISSARIAT A L'ENERGIE ATOMIQUE ET AUX ENERGIES ALTERNATIVES, Paris (FR)

(72) Inventors: Natacha Raphoz, Grenoble Cedex (FR); Stéphane Caplet, Grenoble Cedex (FR); Patrick Peray, Grenoble Cedex (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 393 days.

(21) Appl. No.: 18/258,435

(22) PCT Filed: Dec. 22, 2021

(86) PCT No.: PCT/EP2021/087194
§ 371 (c)(1),
(2) Date: Jun. 20, 2023

(87) PCT Pub. No.: WO2022/136497
PCT Pub. Date: Jun. 30, 2022

(65) Prior Publication Data
US 2024/0021502 A1 Jan. 18, 2024

(30) Foreign Application Priority Data
Dec. 22, 2020 (FR) ...................................... 20 13975

(51) Int. Cl.
*H10W 72/50* (2026.01)
*H10W 70/05* (2026.01)
(Continued)

(52) U.S. Cl.
CPC ......... *H10W 72/50* (2026.01); *H10W 70/093* (2026.01); *H10W 72/071* (2026.01); *H10W 90/701* (2026.01)

(58) Field of Classification Search
CPC ..... H01L 23/49; H01L 21/4853; H01L 21/60; H01L 23/49811; H01L 24/81;
(Continued)

(56) References Cited

U.S. PATENT DOCUMENTS

| | | | |
|---|---|---|---|
| 7,563,703 B2 * | 7/2009 | Brun ................. | H01L 23/49811 438/106 |
| 2006/0057830 A1 * | 3/2006 | Feichtinger ............ | H01C 1/144 257/E23.068 |

(Continued)

FOREIGN PATENT DOCUMENTS

| | | |
|---|---|---|
| EP | 2 618 368 A1 | 7/2013 |
| EP | 3 171 395 A1 | 5/2017 |

(Continued)

OTHER PUBLICATIONS

International Search Report and Written Opinion issued on May 20, 2022 in PCT/EP2021/087194 filed on Dec. 22, 2021, 9 pages.
(Continued)

*Primary Examiner* — Douglas W Owens
(74) *Attorney, Agent, or Firm* — Oblon, McClelland, Maier & Neustadt, L.L.P.

(57) ABSTRACT
A system provided with a microelectronic device includes a substrate exposed on a face of the device, the substrate having at least one electrically conductive element, and an electrical connection member in electrical continuity with the element and including at least one rod projecting over the face of the device, wherein the connection member includes an inorganic anchoring portion covering the element and in that the rod comprises a portion buried in the anchoring
(Continued)

portion followed by a portion projecting over the face of the device.

20 Claims, 13 Drawing Sheets

(51) Int. Cl.
 *H10W 72/00* (2026.01)
 *H10W 90/00* (2026.01)

(58) Field of Classification Search
 CPC . H01L 2224/10126; H01L 2224/11011; H01L 2224/1145; H01L 2224/11452; H01L 2224/1148; H01L 2224/11602; H01L 2224/11901; H01L 2224/11903; H01L 2224/13012; H01L 2224/13014; H01L 2224/13015; H01L 2224/13017; H01L 2224/13022; H01L 2224/13078; H01L 2224/1355; H01L 2224/13562; H01L 2224/1357; H01L 2224/1411; H01L 2224/16058; H01L 2224/16059; H01L 2224/1607; H01L 2224/16227; H01L 2224/17517; H01L 24/13; H01L 2224/81193; H01L 24/11; H01L 24/16
 See application file for complete search history.

(56) References Cited

U.S. PATENT DOCUMENTS

| | | | |
|---|---|---|---|
| 2010/0164117 A1 | 7/2010 | Chen | |
| 2011/0094789 A1 | 4/2011 | Marion et al. | |
| 2013/0020698 A1* | 1/2013 | Hsieh | H01L 24/81 |
| | | | 257/737 |
| 2017/0150615 A1 | 5/2017 | Borel | |

FOREIGN PATENT DOCUMENTS

| | | |
|---|---|---|
| WO | WO 2004/093100 A2 | 10/2004 |
| WO | WO 2015/030670 A1 | 3/2015 |

OTHER PUBLICATIONS

Ikeda et al., "High Frequency Signal Transmission Characteristics of Cone Bump Interconnections", 2011 IEEE International 3D Systems Integration Conference (3DIC), 2011 IEEE International. IEEE, 2012, 5 pages.

Motoyoshi et al., "3D integration technology for sensor application using less than 5 μm-pitch gold cone-bump connpdfection", Journal of instrumentation, vol. 10, Mar. 2015 (Abstract) 1 page.

Qiu et al., "Room-Temperature Cu Microjoining with Ultrasonic Bonding of Cone-Shaped Bump", Japanese Journal of Applied Physics, 52, 2013, 6 pages.

* cited by examiner

100

1164
1163

102

116    116
1164    131
1163    130
1    1162
1161    105
    125

100

HALF-BURIED ELECTRICAL CONNECTION INSERT ROD DEVICE

TECHNICAL FIELD OF THE INVENTION

The present invention relates to the field of assembling electronic devices, and more specifically, the field of microelectronics, this assembly enabling an electrical and mechanical connection of electrical elements of components. The invention has an advantageous, but non-limiting application, in manufacturing microelectronic devices. By "microelectronic device", this means any type of device made with microelectronic means. These devices include, in particular, in addition to devices with a purely electronic purpose, micromechanical or electromechanical systems, as well as optical or optoelectronic devices (matrix screen, laser chips, etc.). These can be LED microscreens, sensors in the visible or infrared range.

From the standpoint of manufacturing methods, the invention particularly relates to the formation of interconnections between two microelectronic devices by an insertion technology. It is advantageously compatible with components having a small implantation step, in particular, less than 5 μm.

It enables a hybridisation by the assembly of elements being completed in a final system; these elements can be, for example, a silicon-based readout circuit and a detection or display circuit. The assembly achieves a connection which is both mechanical and electrical.

STATE OF THE ART

Microelectronic systems are increasingly complex, which involves an increasing number of electrical interconnections between components. It is historically known to transfer components onto other components by way of solder bumps serving as connectors both for the mechanical connection and electrical continuity, and making it possible to reach a certain connection density. Intrinsically, this technology involves the production of thermal cycles at temperatures generally greater than 200° C. which can be disadvantageous for the technical choices to be made, even be incompatible with certain components.

Techniques are also known, consisting of forming, on one of the devices to be assembled, electrically conductive inserts generally in the form of studs, as they have an elongated character. The other of the devices to be assembled comprises electrically conductive terminals. The material of the terminals is chosen as more plastic than that of the inserts. Upon assembly, at least one stud is placed opposite a terminal and a mechanical pressure is exerted so as to insert the rods in the terminal. An advantage of this method is that can be achieved at ambient temperature, as that of the inserts in the form of microtubes. For example, the terminals can be aluminium and copper alloy based, while the inserts are, for example, tungsten-based. This hybridisation technique demands a certain insertion force for which limits are currently reached, in particular for the hybridisation of large matrices. In addition, the step of the connection elements is difficult to reduce, which is disadvantageous for the density accessible via this technique.

An assembly using such rods engaging with conductive terminals, in contact with which the rods are placed, is also known from patent publication FR 2866753 A1. The rods overhang a face of the device that they equip. The manufacture of such rods has proved to be difficult. The result is not mechanically optimised, such that the implementation of this technology for an interconnection by insertion in terminals is not satisfactory.

An aim of the present invention is therefore to propose an improved technique to form connection elements in the form of rods.

Other objects, features and advantages of the present invention will appear upon examining the following description and the accompanying drawings. It is understood that other advantages can be incorporated.

SUMMARY OF THE INVENTION

To achieve this aim, according to an embodiment, a microelectronic device is provided, comprising a substrate exposed on a face of the device, the substrate comprising at least one electrically conductive element, and an electrical connection member in electrical continuity with the element and comprising at least one rod projecting over the face of the device.

Advantageously, this device is such that the connection member comprises an inorganic anchoring portion covering the element and that the rod comprises a portion buried in the anchoring portion followed by a portion projecting over the face of the device.

Thus, the rods are anchored in the dielectric layer, which ensures a mechanical resistance greater than the inserts, such as microtubes, encountered up to now. While there is a general prejudice tending to think that the connection parts must be added-on elements strictly projecting at the surface of the devices, in this case a solution based on a buried portion of the connection parts is proposed, thus in the form of rods.

Another aspect relates to a system with a device such as described above and a complementary microelectronic device comprising at least one electrically conductive complementary element and a terminal which is electrically connected to the complementary element, and which is exposed on a face of the complementary device, the at least one rod being inserted in the terminal.

Another aspect relates to a method for manufacturing a microelectronic device comprising a substrate exposed on a face of the device, the substrate comprising at least one electrically conductive element, and an electrical connection member in electrical continuity with the element and comprising at least one rod projecting over the face of the device, characterised in that it comprises:

a provision or a manufacturing of the substrate comprising the covered element of an inorganic anchoring portion and comprising a via provided with a first end and a second end opposite the first end, the via passing through the anchoring portion, such that the second end is flush with the surface of the anchoring portion, an only partial removal of the anchoring portion configured to remove only some of the thickness of the anchoring portion by leaving a residual part of the anchoring portion, the via thus forming the rod with a part of the removed via relative to the residual anchoring portion to form a projecting portion and a part of the via preserved in the residual anchoring portion to form a buried portion.

Another aspect relates to a method for manufacturing a system comprising the microelectronic device and the complementary microelectronic device. These two devices are electrically connected. The at least one rod of the microelectronic device is inserted in a terminal of the complementary microelectronic device.

According to an example, the rod is formed with at least one first section and one second section following each other according to its dimension by height, the first section having a section transverse to the dimension by height greater than that of the second section.

According to an example, the removal comprises an etching of the anchoring portion.

The rods are thus easily formed, which will serve as inserts during the assembly between two devices. Technologically, the creation of the rods is fully controllable by resorting to the methods for developing vias passing through substrates. In this case, the intention of these manufacturing methods is diverted, which usually relate to conductive parts only extending into the thickness of the substrates, to form inserts having a portion exposed projectingly over the face of the device, this exposed portion even being able to be a main part of the height of the rod thus manufactured.

BRIEF DESCRIPTION OF THE FIGURES

The aims, objectives, as well as the features and advantages of the invention will best emerge from the detailed description of an embodiment of the latter, which is illustrated by the following accompanying drawings, wherein.

Figure 1:
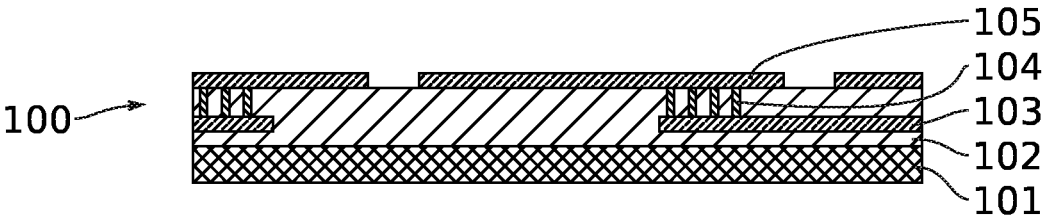
FIG. 1 represents an example of a substrate configuration, on the basis of which the manufacture of connection rods can be done.

The drawings are given as examples and are not limiting of the invention. They constitute principle schematic representations intended to facilitate the understanding of the invention and are not necessarily to the scale of practical applications. In particular, the thicknesses are not representative of reality.

DETAILED DESCRIPTION OF THE INVENTION

Before starting a detailed review of embodiments of the invention, optional features are stated below, which can optionally be used in association or alternatively.

the buried portion 1161 forms at least 5%, optionally at least 10%, of a dimension by height of the rod 116. Alternatively or complementarily, the buried portion can represent at least 50 nm.

the buried portion 1161 forms at most 20% of a dimension by height of the rod 116.

the anchoring portion 113 fully covers an upper face of the electrically conductive element 105. In this way, the electrically conductive element to be connected is coated in the substrate.

the rod 116 comprises a first end in contact with the element 105.

the rod 116 is electrically conductive. It can ensure, by itself or not, the electrical connection of the element 105.

the anchoring portion 131 is electrically insulating. It can serve to insulate the element 105, by forming a dielectric coating above the element 105. A layer underlying the element 105, of the same material or not, also dielectric, advantageously complete this insulation.

the anchoring portion 131 is made of silicon dioxide. This constitutes a choice of which the manufacturing is easy.

the anchoring portion 131 is electrically conductive. An interest can be to have a larger contact surface with the element.

the rod 116 is electrically insulating and the connection member 130 comprising an electrically conductive coating 132 in contact both with the projecting portion of the rod and of the anchoring portion.

the coating 132 totally covers the projecting portion.

the dimension by height of the rod 116 is greater than 1 μm and/or less than 3 μm.

the rod 116 comprises at least one first section 1163 and one second section 1164 following one another along its dimension by height, the first section 1163, extending optionally from the element, having a transverse section to the dimension by height greater than that of the second section 1164. The shape of the transverse section of the first section can be different from that of the second section. The two sections are not necessarily centred along the dimension by height of the rod.

the buried portion 1161 is fully comprised in the first section 1163.

the rod 116 has a transverse section chosen from among the following shapes: circular, annular, polygonal, cross.

the rod 116 is formed with at least one first section 1163 and one second section 1164 following one another along its dimension by height, the first section 1163 having a section transverse to the dimension by height greater than that of the second section 1164.

the removal comprises an etching of the anchoring portion, preferably, the removal comprises an etching of the dielectric portion 102.

It is specified that, in the scope of the present invention, the term "on" or "above" does not compulsorily mean "in contact with". Thus, for example, the deposition of a layer on another layer, does not compulsorily mean that the two layers are directly in contact with one another, but this means that one of the layers covers the other at least partially, by being either directly in contact with it, or by being separated from it by a film, also another layer or another element.

A layer can moreover be composed of several sublayers of one same material or of different materials.

By an element "with the basis" of a material A, this means an element comprising this material A only, or this material A and optionally other materials. For example, the element comprises a material A and an envelope configured to contain the element A, the envelope being able to be formed of at least one material distinct from the material A.

A material is considered as inorganic as soon as it is not a carbon material. This includes metals (like aluminium), oxides and metal alloys, as well as semi-conductive materials or semi-conductor-based materials, like silicon, silicon nitride or silicon dioxide. Carbon chain polymer materials are excluded from this.

By a parameter "substantially equal to/greater than/less than" a given value, this means that this parameter is equal to/greater than/less than the given value, plus or minus 10%, even plus or minus 5%, of this value.

In the detailed description below, use can be made of terms such as "longitudinal", "transverse". These terms must be interpreted relative to the substrate or to the dimension by thickness of the devices. Thus, a height or a thickness of an element or a layer means a dimension along the thickness of the substrate which carries it or contains it. A width, or also a section or a transverse dimension means a dimension perpendicular to the thickness of the substrate.

Certain parts of the device of the invention can have an electrical function. Some are used for electrical conduction properties and by electrically conductive or equivalent, this means elements formed of at least one material having a sufficient conductivity, in the application, to achieve the desired function. Other parts, on the contrary, are used for electrical insulation properties, and any material having a sufficient resistivity to achieve this insulation are concerned and are, in particular, called dielectric or electrically insulating.

An aspect of the invention is the electrical connection of one or more electrically conductive elements of a first device with at least one electrically conductive element, called complementary, of another device, assembled with the first. The term "electrically conductive element" means any part of a microelectronic device having an electrical function at the very least. Preferably, the element is the last interconnecting metal level of an electronic component. Advantageously, the element has a planar geometry, directed perpendicularly to the dimension by width of the substrate. This can be an electrically conductive pattern implemented in a microelectronic device, of an end of a through via, of an electrical distribution line buried in the device, or a connector associated with a more complex component having, for example, an optical function emitting or receiving light, or electronic, such as a transistor, or a sensor, a chip, an integrated circuit, an electromechanical or optoelectronic component.

Figure 36:
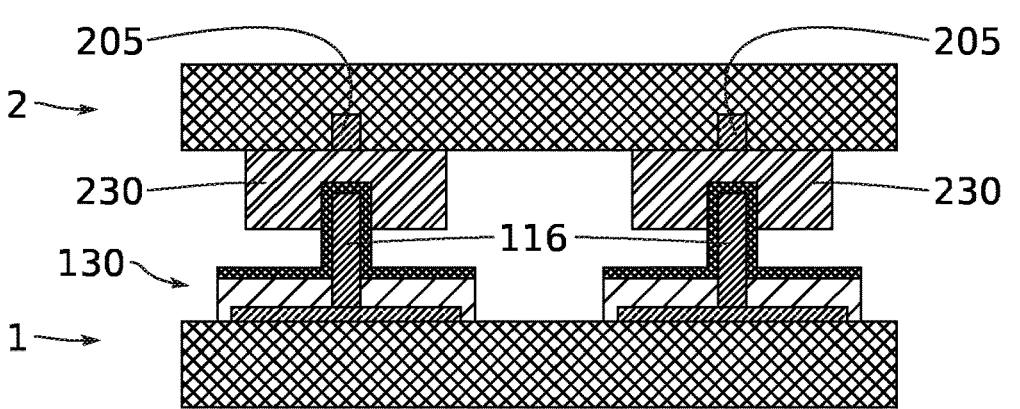
Figure 43:
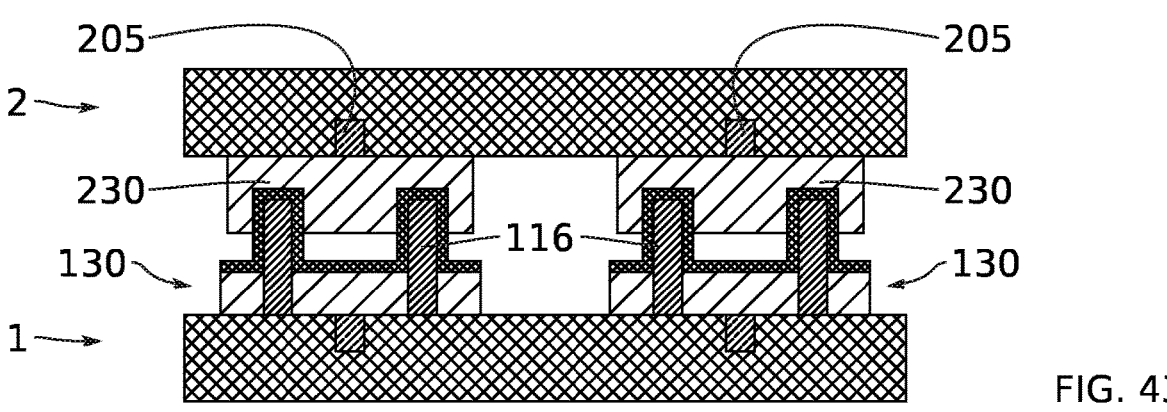

Below, examples of embodiments of the invention are described, with steps of the manufacturing method. Generally, the aim is to produce a microelectronic device 1 comprising an electrical connection member 130 of an electrically conductive element 105, the connection member 130 itself comprising at least one connection rod which comprises a portion buried in an anchoring portion 131 and a portion projecting over a face of the device. The projecting portion at the least intends to serve as an insertion relief in a complementary connection member, typically in the form of a terminal 230 which is more plastically deformable than the rod 116, the terminal being advantageously ductile. FIGS. 36 and 43 show two examples to thus connect the electrically conductive element 105 and a complementary electrically conductive element 205 of a complementary microelectronic device 2.

Preferably, the buried portion of the rod 116 is in contact with the anchoring portion over the whole dimension by height of said buried portion; the technical effect is that an anchoring is profiled over the whole available height, to the top of the anchoring portion.

In certain embodiments, the rod(s) 116 serve(s) the electrical conduction by making it possible to connect the element 105 to the outside. In this case, they will be made of electrically conductive material. In other situations, the invention implements an electrical connection by other means, and in particular, by using an anchoring portion 131 made of electrically conductive material, as well as a coating 132 covering at least some of the surface of the projecting portion of the rod while being, moreover, in contact with the anchoring portion 131.

According to an option, the anchoring portion 131 is formed of one single material, and preferably deposited in one single layer.

Figure 14:
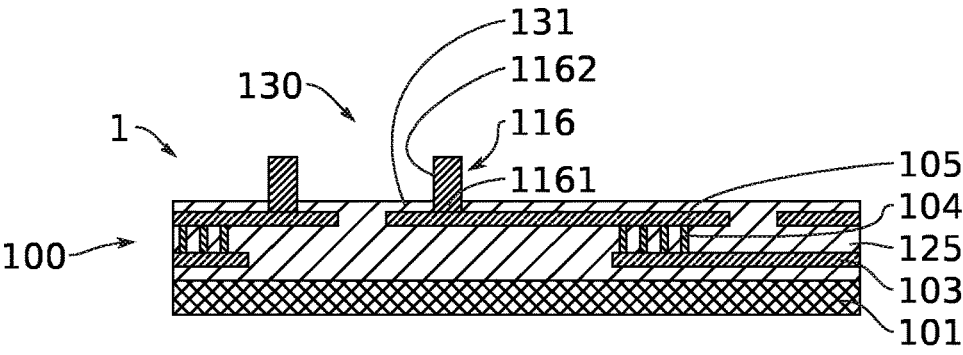

A first option of an embodiment of the connection member 130 can, for example, be seen in FIG. 14 and corresponds to an embodiment, wherein the rod 116 achieves, or at the very least contributes to achieving, the electrical connection of the element 105. A device made based on a substrate 100 is represented in this case, which comprises, for example, a base layer 101, which can be made of silicon, within a dielectric layer 125, one or more elements 105 having an electrical function. For example, the dielectric layer can be made with the basis of or made of silicon dioxide. Naturally, there can be other materials serving as electrical insulation, and for example, an oxide or other semi-conductive materials, like germanium, or also a silicon nitride or a nitride of other semi-conductive materials, like germanium. Non-semi-conductive materials can also be used, like metal oxides, such as Al2O3. Generally, as indicated above, a layer can have several sublayers. The materials can be different for each of the sublayers.

The case represented is purely illustrative. It shows a three-dimensional structure with different levels of elements. In this example, two levels are present, with first-level electrical elements 103 connected by one or more vias 104 to second-level elements 105. Examples of types of elements that it is possible to implement have been given above. In the illustration, these can typically be electrical distribution lines through the device.

Generally, one or more elements 105 merit a connection to one or more complementary elements 205 of another device 2. To this end, according to the invention, such elements can be present as buried in the device, and particularly within the dielectric layer 125. Preferably, the element 105 is not at all exposed to the face of the device, and this typically enables an effective electrical/magnetic insulation of this element 105. However, to connect it to the outside, the device of the invention comprises one or more rods 116.

The word "rod" means an elongated element in this sense that it has, in a direction, a dimension greater than that, that it has in the other directions; this direction, in this case called dimension by height, is oriented along the thickness of the substrate 100. The transverse section of a rod 116 is not limited, but they can, for example, be cylindrical rods, advantageously of a circular section. For example, the complete height of a rod can be greater than 1 μm and/or less than 3 μm. The shape ratio between the largest dimension of a rod in its transverse section and the dimension by height can be greater than 20%, even be greater than 30%, and/or be less than 60%, even be less than 50%.

Characteristically, a rod 116 comprises two portions which follow one another in the direction by height of the rod 116. A first portion, called buried portion 1161 means, in the scenario of FIG. 14, inside the dielectric layer 125 which produces the anchoring portion 131 around the rod 116. The lower end of the rod is, in this case, in contact with the upper face of an element 105 so as to put them into electrical continuity. The other end of the buried portion 1161 is located at the face of the device, and it is followed from the lower end of a projecting portion 1162 of the rod 116. This second portion projects above the face of the device, so as to form a relief on the latter.

According to an option, the height of the buried portion 1161 corresponds to at least 5%, even to at least 10% of the total height of the rod 116 and/or to at most 20% of the total height of the rod 116. Alternatively or complementarily, the height of the buried portion 1161 can be of at least, or greater than, 50 nm.

According to an option, the total height of the rod is greater than or equal to 500 nm, even 700 nm, and is typically greater than or equal to 1 μm.

The structure of each rod 116 is configured to ensure an electrical conduction along its height, so as to achieve the interconnection function of the element 105 with an external complementary element. To this end, a rod 116 can comprise one or more electrically conductive portions. For example, the rod 116 has a metal pattern, for example tungsten-based or made of tungsten, which extends over the whole height.

Figure 15A:
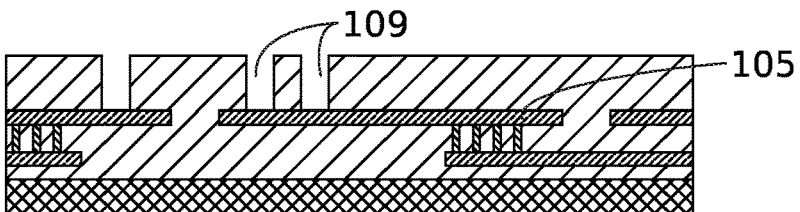
FIGS. 15A and 15B give an embodiment variant.
Figure 15B:
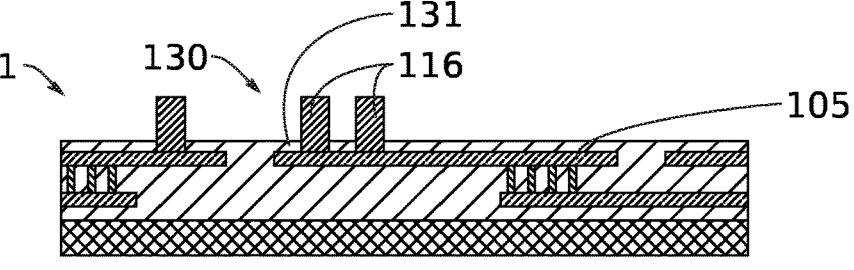
Figure 16:
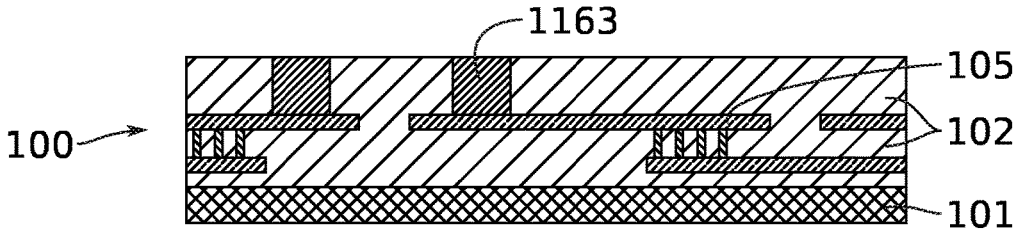
FIGS. 16 to 26 provide an example of advantageously successive steps for the manufacture of rods according to another embodiment.

The number of rods 116 present in the device is not limited, nor even the number of rods 116 allocated to the connection of a given element 105. Thus, while FIG. 14 provides an example of a rod 116 by element 105, FIG. 15B shows that an element 105 can be provided with a plurality of rods 116. This case remains schematic and a greater number of rods can be implemented. In particular, according to an option of the invention, a matrix of rods 116 is used to connect an element 105. This makes it possible to distribute the electrical and mechanical function between different rods 116. The step can be less than 5 μm.

According to an example, the complementary device 2 to which the device is to be connected comprises, for each element, at least one terminal 230 capable of engaging with the rod(s) 116. Preferably, this engagement is done by insertion of the rods 116 in the terminal 230, with, preferably, a plasticising of the material of the terminal during this insertion. More specifically, the projecting portion 1162 of each rod 116 is pressed on the terminal, which leads to the insertion of this portion in the terminal of 130. Advantageously, the shapes and dimensions of the projecting portion are adapted, in particular in terms of shape ratio and height, to enable its insertion in the terminal 230.

Preferably, the shape ratio of the projecting portion of the rod is configured to enable its insertion in the terminal 230. According to an option, the shape ratio, between the largest dimension of the projecting portion of a rod in its transverse section and the dimension by height, can be greater than 20%, even be greater than 30%, and/or less than 60%, even be less than 50%.

Advantageously, the height of the projecting portion 1162 is greater than or equal to 300 nm, even 500 nm, even 700 nm, even 1 μm.

Now, a continuation of potential steps is described to arrive at the device represented in FIG. 14.

FIG. 1 represents a substrate 100 which could serve as a starting point in the construction of the rods 116.

The substrate 100 comprises the base layer 101, a dielectric portion 102 which can serve to form a part of the final dielectric layer 125, a part of which surrounding the rod serves as an anchoring portion 131, and as elements 103, 105. In this example, the elements 103 are connected to the upper-level element 105 by vias 104. The elements 105 are exposed to the surface of the substrate 100. They can be produced by a metal deposition followed by a lithography and an etching making it possible to define patterns producing the elements 105. For example, the deposited metal can be an alloy comprising titanium, aluminium, copper, etc.

Figure 2:
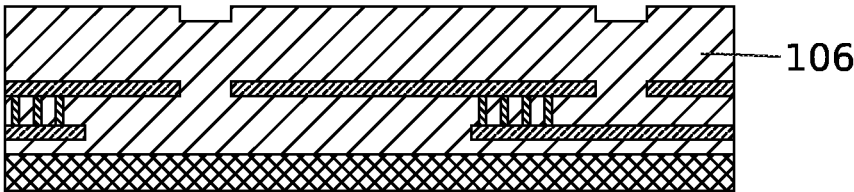
FIGS. 2 to 14 represent advantageously successive steps of producing rods.

In FIG. 2, a deposition 106 has been produced to increase the height of the dielectric portion, for example with silicon dioxide. This deposition can be executed by a method of the high density plasma chemical vapour deposition type, known as HDP CVD, with $SiH_4$ as a precursor. For example, a filling of a height of around 1 μm can be achieved.

Figure 3:
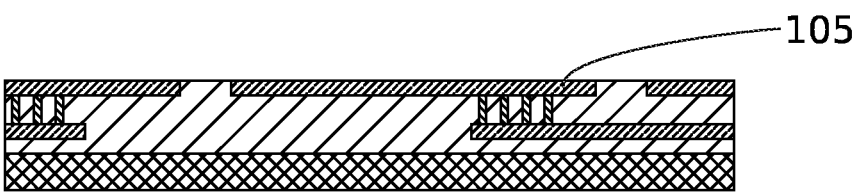

Then, a removal is performed by polishing, such as a chemical and mechanical polishing by using the surface of the elements 105 as a stop layer, so as to obtain a flat surface, corresponding to the situation of FIG. 3.

Figure 4:
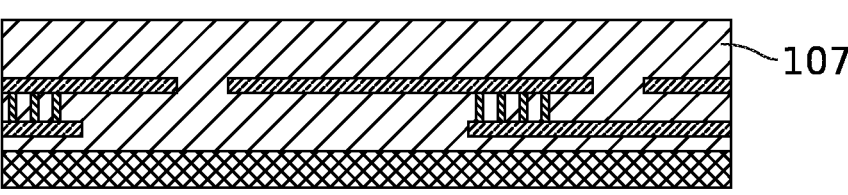

Based on this optimised surface state, another deposition 107 of dielectric material is performed, which makes it possible to bury the elements 105, as shown in FIG. 4. For example, this can be a silicon dioxide deposition by plasma-enhanced chemical vapour deposition, known as PECVD, from tetraethoxysilane (known as TEOS). There again, a thickness of around 1 micrometre is possible. Typically, a deposition thickness corresponding to the rod height ultimately sought is achieved.

Based on this, holes will be produced, serving to form vias, which themselves will become rods 116.

Figure 5:
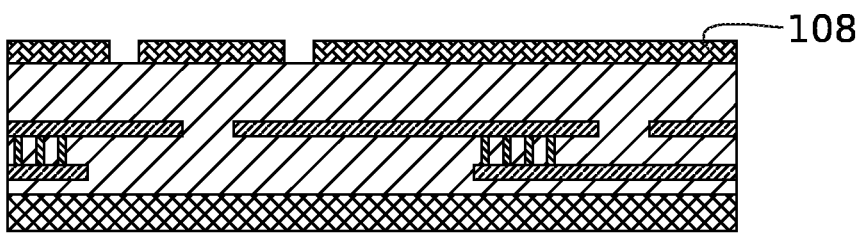
Figure 6:
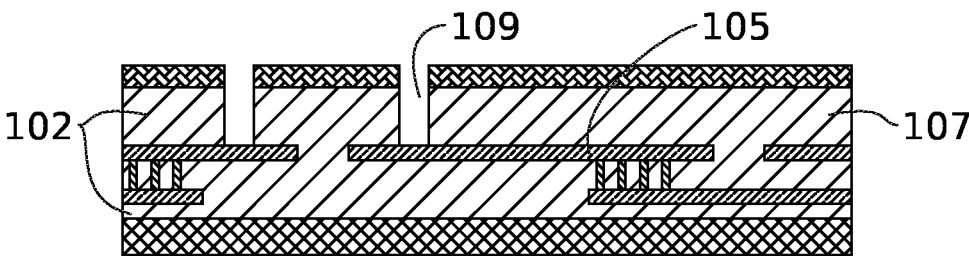
Figure 7:
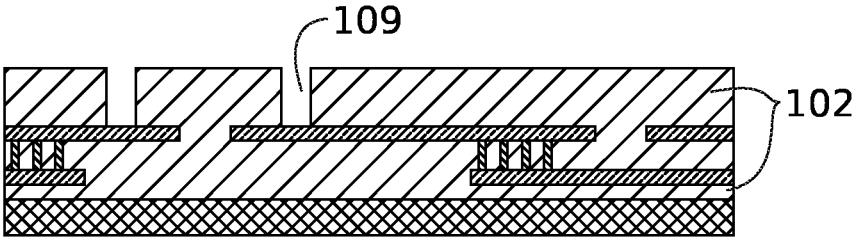
Figure 8:
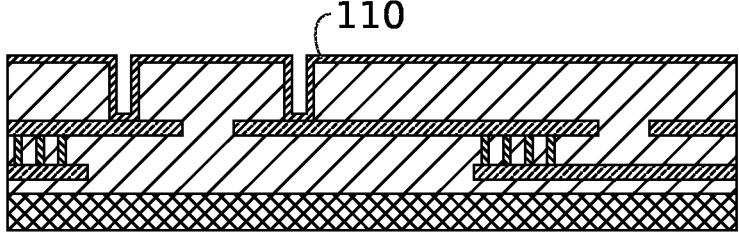

Thus, FIG. 5 shows the formation of a mask 108, which could be implemented by usual photolithographic techniques. This mask comprises patterns, making it possible to define, in a cavity, exposure zones of the dielectric portion at which holes 109 will be produced (to the right of the element 105 to equip rods), typically by an etching, typically by plasma, of the material of the deposition 107, as FIG. 6 indicates. The material of the face of the element 105 serves as a stop layer to this etching. The mask is then removed, to obtain the result of FIG. 7.

The formation of the via thus starts, strictly speaking. The latter can start by the deposition of a layer 110 which could serve as a bottom layer of the via. This layer can serve as an adherence layer (for example, made of Ti) and/or as a diffusion barrier (for example, made of TiN). This can be a physical vapour deposition (PVD).

Figure 9:
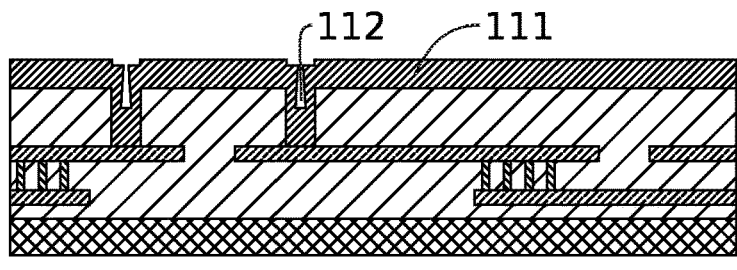
Figure 10:
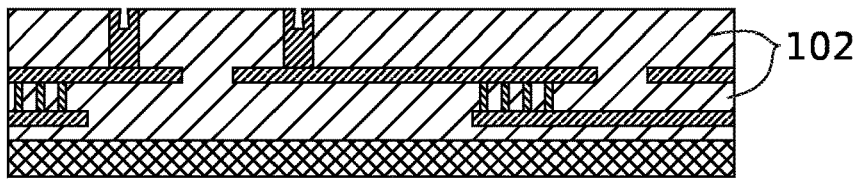
Figure 11:
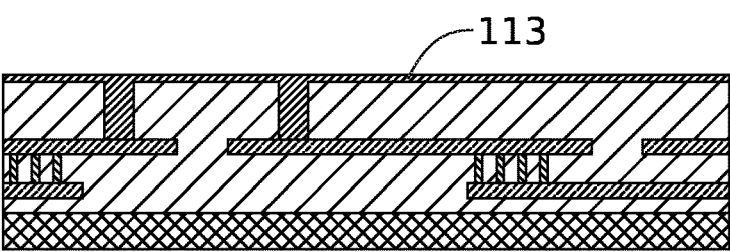

A more substantial filling is then performed in one or more cycles, so as to optimise the filling. This case is represented in FIG. 9 with a deposition of a layer 111, for example by chemical vapour deposition in one or more times, followed, in FIG. 10, by a polishing to which a second deposition 113 succeeds, for example always by chemical vapour deposition, so as to fill possible voids 112 which would have been able to be initiated during the first filling, as is the case in FIG. 11. The filling can be done with a tungsten-based material, for at least one of the depositions, preferably the first. Optionally, the second deposition can be made of TiTiN.

Figure 12:
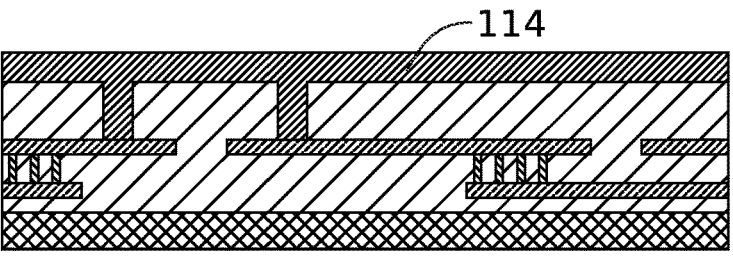

In FIG. 12, a last deposition 114 has been performed, for example by CVD, for example made of tungsten. It optionally fills residual holes.

Figure 13:
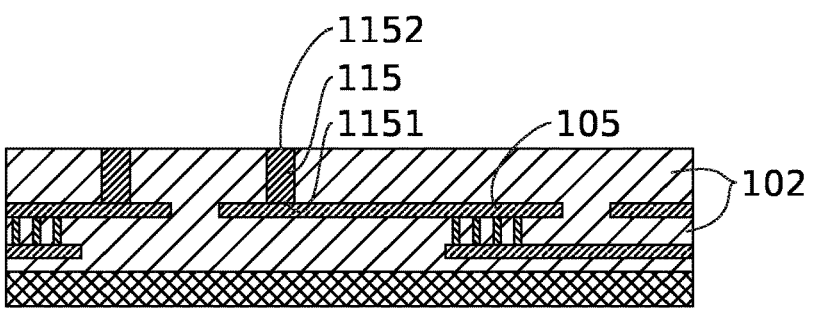

After a polishing, with stopping at the top of the via 115, the situation of FIG. 13 is reached, at the level of which an end 1152 of the via is exposed to the surface of the substrate 100 intended to form the device. The rest of this surface is advantageously defined by the dielectric layer deriving from the dielectric portion 102. The other end of the via, bearing the reference 1151, is connected to the element 105.

Then, the configuration described in reference to FIG. 14 is reached, by a removal of a superficial part of the dielectric portion 102. This can be a solid plate etching. This etching is selective in this sense that it removes the dielectric material, while preserving the material of the vias thus forming the rods 116. The time for which the thickness of the dielectric material is etched can be controlled. A plasma etching with TEOS can be used.

For example, it can be arranged to obtain an etching of 80% of the thickness of dielectric material surmounting the element 105, so as to preserve a height of 20% serving to bury the portion 1161 of the rods 116.

To arrive at the embodiment represented in FIG. 15B, it is sufficient simply to form a plurality of holes 109 to the right of a given element 105 and to perform phases of defining vias corresponding to this plurality.

Figure 26:
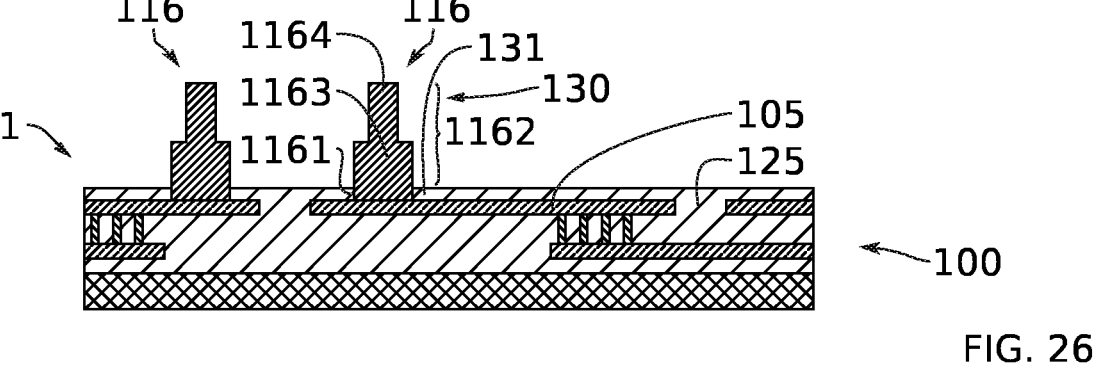

Another example of rod configuration is given in FIG. 26. Preferably, the electrical connection member 130 comprises in this case, always at least one electrically conductive rod 116. As above, the anchoring portion 130 can be electrically insulating. This makes it possible, in particular, to use a layer completely covering the face of the device to produce the anchoring portion 130 there. Below, it will be seen that this arrangement is not however limiting at all.

As above, based on a substrate 100, comprising elements 105 to be connected, the rods 116 have been formed, which each comprise a buried portion 1161 in a dielectric layer 125 and a projecting portion 1162 forming a projection above the layer 125.

However, in this case, the rod 116 comprises a section variation with, along its height, a first section 1163 followed by a second section 1164 of more reduced section. Preferably, the sections follow one another in the direction by height of the rod by being centred on the longitudinal direction of the rod. The sections can have a transverse section of the same shape or not. The rods thus formed comprise a wider base, offering a greater mechanical resistance, and this, all the more than the buried portion of the rod is located at the first section. The anchoring of each rod in the anchoring portion 131 done in the dielectric layer 125 is only better. An alternative or complementary advantage is to enable a greater rod height, thanks to a basal portion, the first section, of a greater lateral dimension.

For example, a section 1163 of a height substantially of 1 μm can be made; as above, the section can be circular and the diameter is thus, for example, substantially of 1 μm.

For the second section 1164, it can, for example, have a transverse section 50% narrower than that of the first section 1163. Its height can be substantially the same.

For example, a rod 116 of a height of substantially 1.5 to 2 μm can thus be formed.

To achieve such a result, steps of the method are presented from FIG. 16 to FIG. 26. The situation of FIG. 16 corresponds to the result which had been obtained in the preceding example, to FIG. 13. In this case, for the example, the via part formed, producing the first section 1163, is wider than before. Based on this, rather than removing a part of the via to reveal it on the surface of the dielectric layer as described in the preceding example, a second via portion, corresponding to the second section 1164 is produced.

Figure 17:
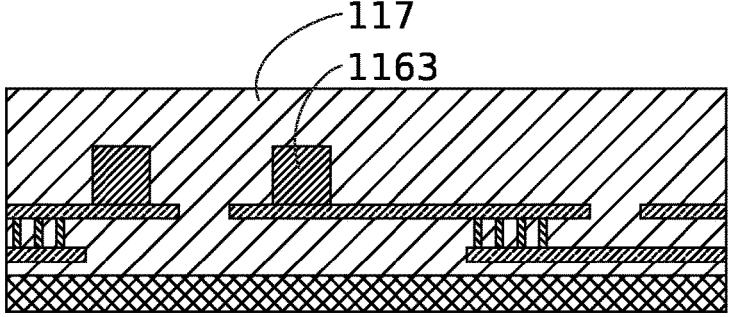

Thus, FIG. 17 shows another deposition 117 of dielectric material to cover the first section 1163 over a height corresponding to the height of the second section to be produced. Deposition techniques described above can be suitable.

Figure 18:
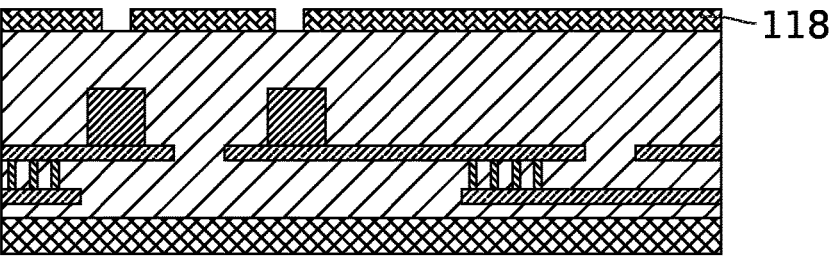
Figure 19:
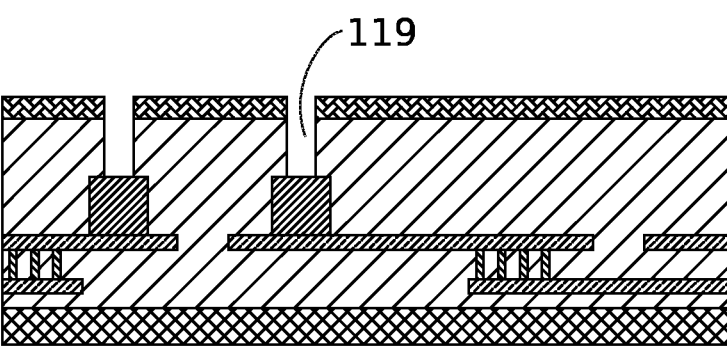
Figure 20:
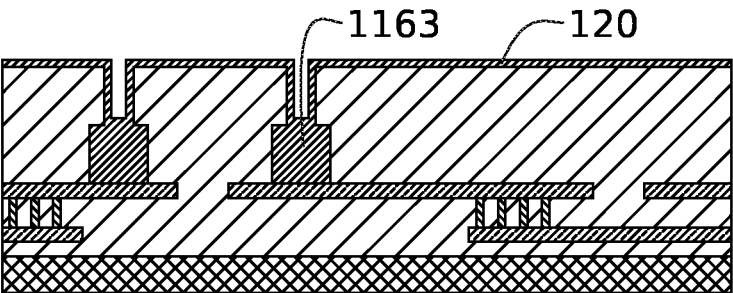
Figure 21:
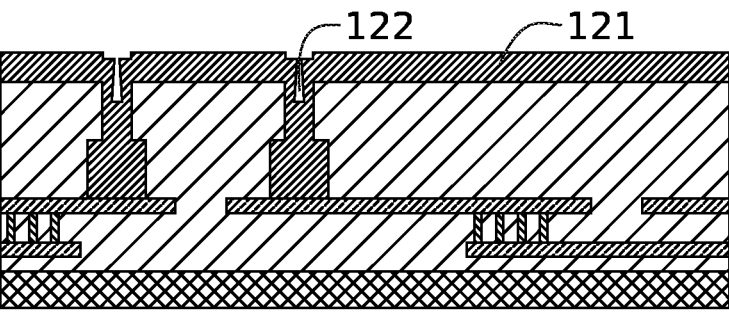
Figure 22:
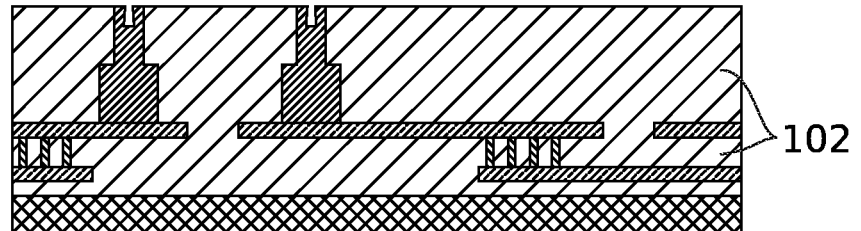
Figure 23:
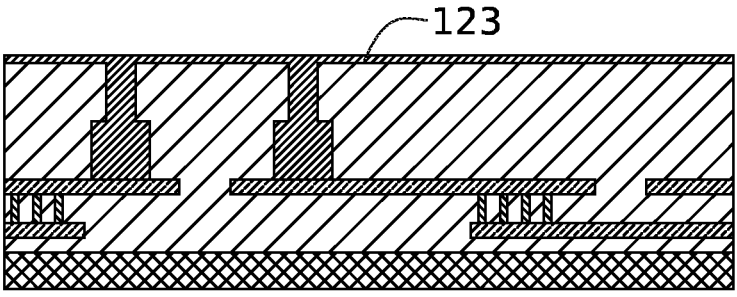
Figure 24:
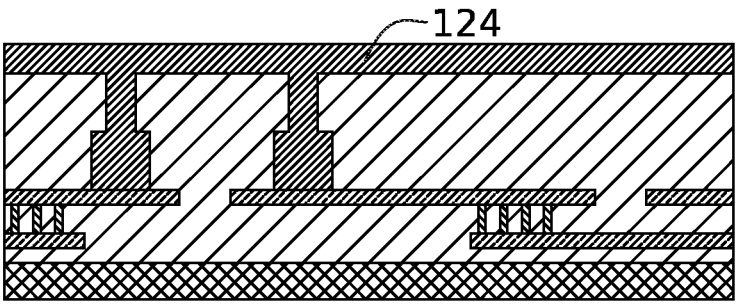
Figure 25:
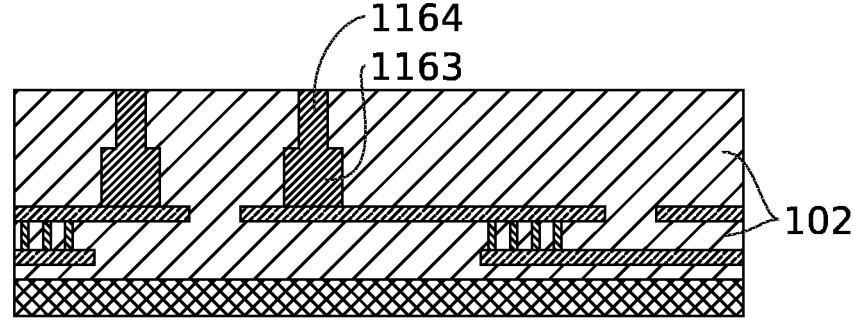

The succession of steps below, from FIG. 18, is potentially very similar to the succession of steps presented in reference to FIGS. 5 to 13. Indeed, the layer coming from the deposition 117 can then form the subject of a definition of holes by a masking 118, an etching of the holes 119 (the upper end of the first section 1163 can be used as a stop layer of this etching), then successive depositions 120, 121, 123, 124 which can be similar respectively to the depositions 110, 111, 113, 114.

As above, a part of the via is revealed on the layer 125, preferably by an etching making it possible to remove the dielectric material of the layer 102 from its surface.

According to an option, the vias are defined in a substrate coming from a first industrial site. They are then provided on another site, to undergo the partial removal defining the buried portion and the exposed portion of the rods, then, preferably on the same site, the assembly with another complementary device is ensured. Naturally, the set of steps can be carried out on one same site.

Figure 27A:
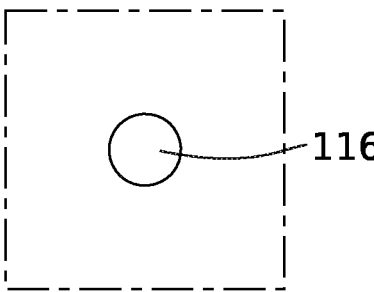
FIGS. 27A to 27C show three indicative rod section shape options.
Figure 27B:
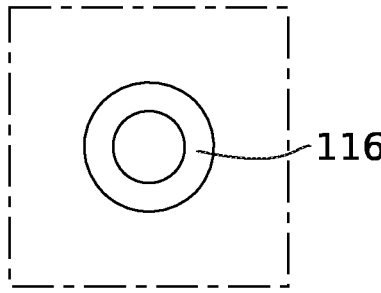
Figure 27C:
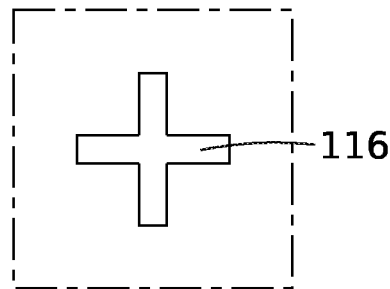
Figure 28:
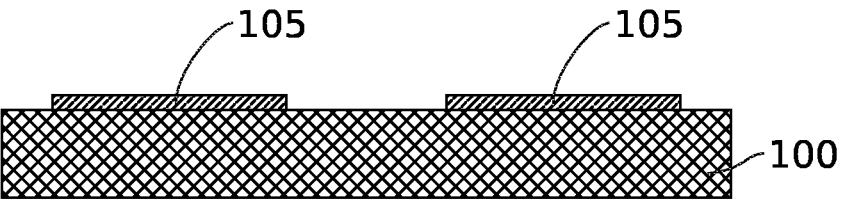
FIGS. 28 to 33 provide an example of advantageously successive steps for the manufacture of rods according to another embodiment.
Figure 29:
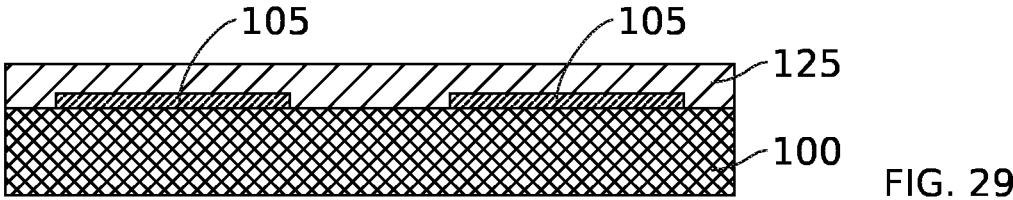

FIGS. 27A to 27C provide three indicative illustrations of transverse section that a rod 116 can adopt. In the situation of FIG. 27A, the hole has been shaped to produce a rod 116 of solid circular section; FIG. 27B gives another example with an annular section, the centre of this section could be empty by thus forming a microtube or filled with another material, for example less conductive, but more rigid than the material of the rod 116 itself. A third indicative case is revealed by FIG. 27C with a cross shape. These arrangements are not limiting and, in particular, a polygonal, for example square, or any other shape section can be resorted to.

Figure 30:
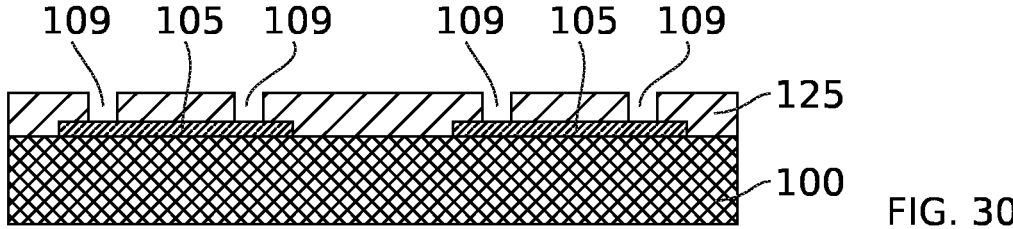
Figure 31:
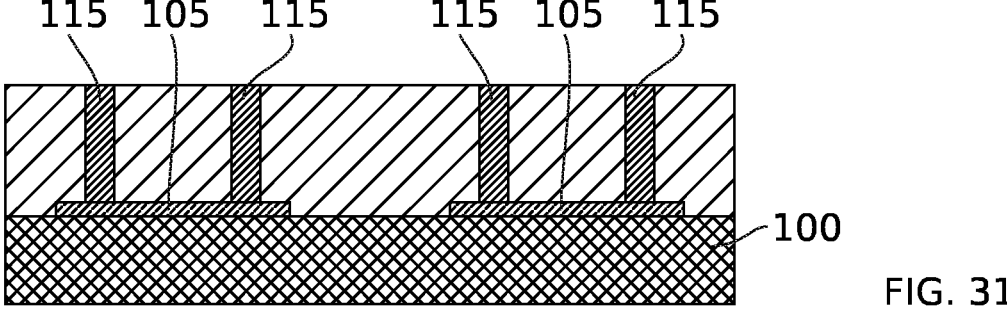
Figure 32:
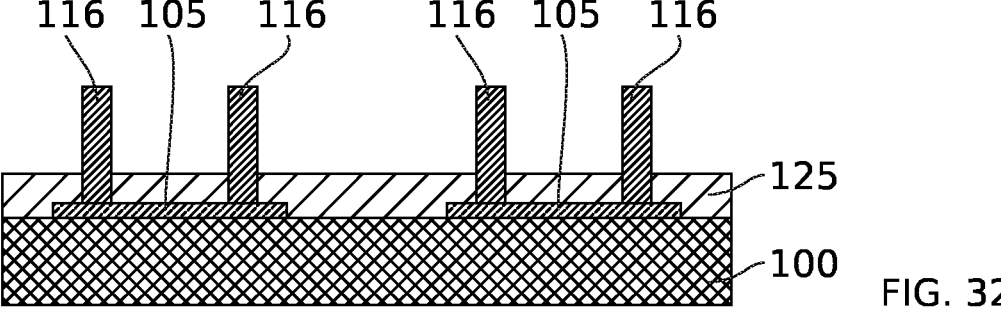

The embodiment corresponding to FIGS. 28 to 33 is close to the preceding ones. A substrate 100 is started with, carrying one or more electrically conductive elements 105. As above, the elements 105 are coated in a layer, in this case, also a dielectric layer 125, for example. However, it will be seen that this could be an electrically conductive layer. This layer can form a height of 1 to 4 μm above the upper face of the element 105. Overall, the steps described above can be followed to form holes 109 in the layer 125, then vias 115 intended to form the rods 116 represented in FIG. 32. Moreover, the configuration obtained in this figure substantially corresponds to the example of FIG. 15B excluding the absence of elements 103 of underlying electrical conduction level, the elements always being able to be present or not. On the other hand, as FIGS. 30 and 31 show, in this case, a two-part construction (even a construction of more than two parts) of the vias is benefited from, to obtain a greater height with a shape ratio favouring the height. Contrary to the example obtained in FIG. 26, in this purely indicative example, a continuity of the different via sections is achieved, without variation of transverse section.

Figure 33:
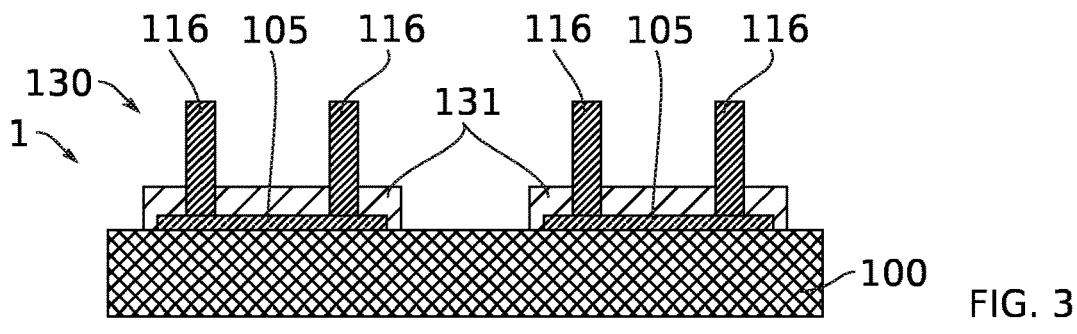
Figure 34:
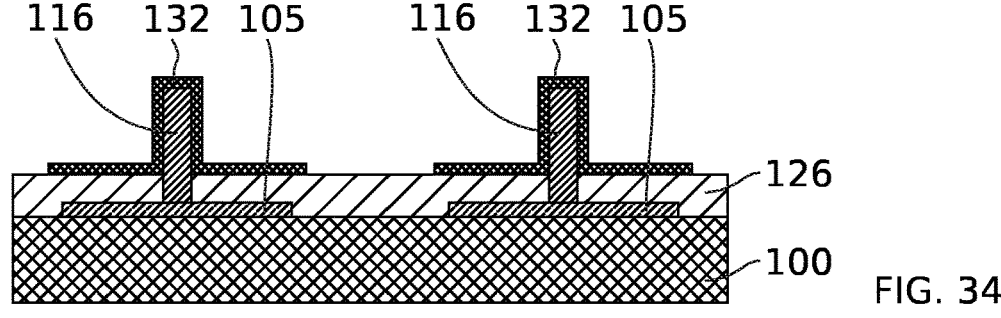
FIGS. 34 to 36 give another embodiment variant.

Differently, FIG. 33 shows that patterns in the layer 125 are defined, so as to laterally delimit the anchoring portion 131 of the connection member 130 around the rods 116. Preferably, this delimitation preserves a complete coating of the element 105, even though it is fully buried, i.e. that its surface is fully non-exposed on the face of the device. As mentioned above, this configuration further makes it possible to use, for the anchoring portion 131, electrically conductive materials, by ensuring to electrically insulate the anchoring portion 131 relative to the rest of the face of the device.

The lateral delimitation of the anchoring portion 131 can be performed by etching so as to form a cut-out.

Figure 35:
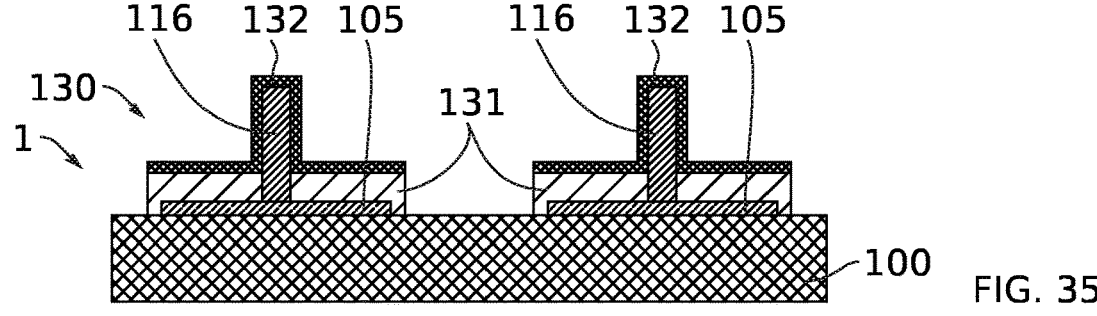

Another variant emerges from FIGS. 35 to 36: a coating 132 of an electrically conductive nature, is done above the rod 116 and of the exposed face of the layer serving to form the anchoring portion 131. In this case, for the example, this layer is in the form of an electrically conductive layer 126. At the very least, it is arranged such that the coating 132 forms a conductive part in continuity with the underlying anchoring portion 131, this conductive part being shaped, moreover, around the projecting part of the rod 116 so as to benefit from an electrical conduction with a terminal 230 during the connection of a complementary microelectronic device 2.

As above, the anchoring portion 131 can be cut out to electrically insulate each of the electrical connection members 130 as FIG. 35 shows.

FIG. 36 has the electrical connection solution between the devices 1 and 2 with this solution. The terminal 230 is itself electrically connected to the complementary electrically conductive element 205, even though hybridisation is carried out in this way.

FIGS. 37 to 43 show another embodiment, in particular reflecting that it is not necessary that the rod(s) 116 is/are in contact with the element 105.

In particular, the male shape of the rod (known also under the terms "micro-insert", "microtip" or "stud") is, in this case, at the very least, mechanically intended for the assembly with the terminal 230, even though the rod(s) 116 is/are not necessarily electrically conductive neither in this configuration.

Figure 37:
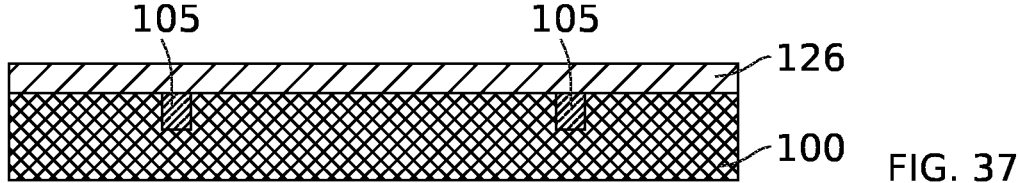
FIGS. 37 to 43 provide an example of advantageously successive steps for the manufacture of rods according to another embodiment.
Figure 38:
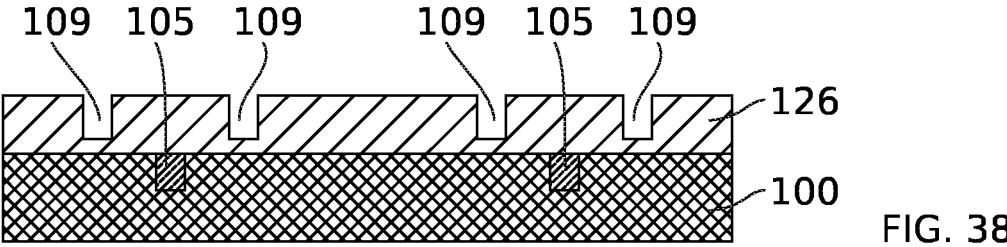
Figure 39:
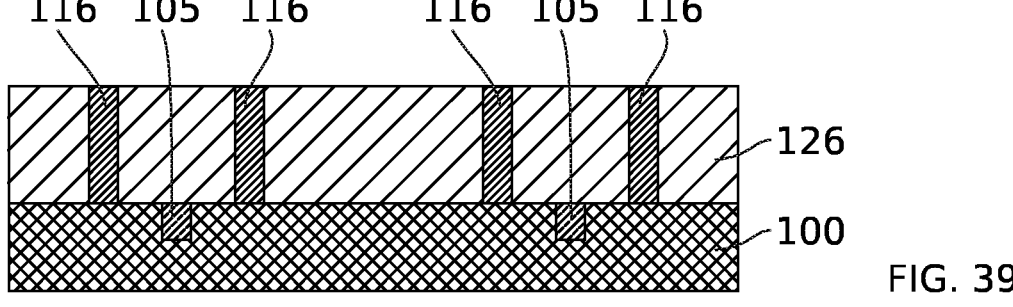

The elements 105 of a substrate 100 are first covered by an electrically conductive layer 126 like in FIG. 37. In FIG. 38, as above, holes are made in this layer in the perspective of manufacturing vias. These holes can be made, so as to pass through the whole thickness of the layer 126, or not. Always as above, these holes, and the associated via sections, can be produced successively, to increase the final rod 116 height, and therefore also the shape ratio. In this scenario, the location of the rods 116 is configured to not come into contact with the element 105, or at the very least, to not totally cover it. The latter remains surmounted by the electrically conductive layer 126.

Figure 40:
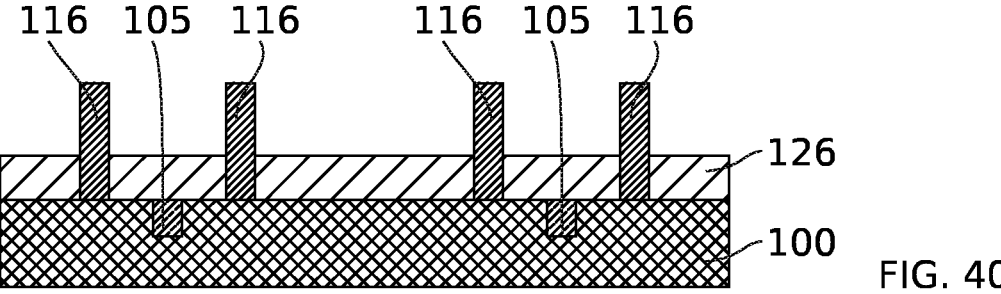

Thus, in the configuration of FIG. 40, an element 105 is surrounded by two rods 116 which have, as above, a portion buried in a layer, in this case, the conductive layer 126.

Figure 41:
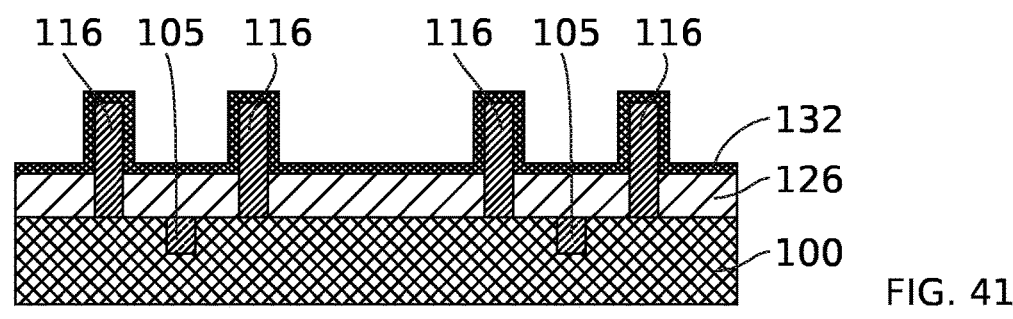
Figure 42:
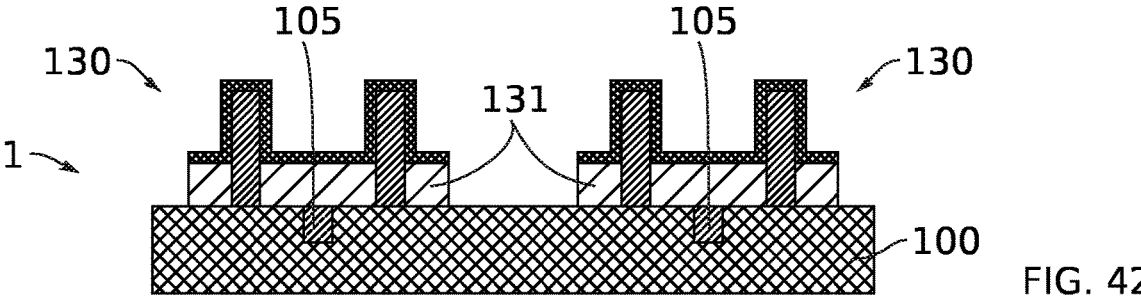

An electrically conductive coating 132 is also benefited from, the deposition of which is illustrated in FIG. 41, to cover, by an electrical conductor, the projecting part of the rods, in continuity with the layer 126.

The following step is similar to that discussed for FIG. 35, the connection members 130 present on the face of the device being individualised to insulate them from one another. In this case, it is therefore only through the electrically conductive material of the anchoring portion 131 that the electrical continuity is performed to the top of the projecting parts of the rods 116. Optionally, the rods 116 can be made so as to surround the component. At least one pair of rods, even a plurality of rods, can be used, for example organised in a circle, around the element 105.

Generally, the number of rods is not limited and all the examples given above can be used with at least one rod, optionally two rods, even more than two rods, for a connection member 130 considered. The number of connection members 130 available on the surface of the microelectronic device is not limited either. Optionally, several members 130 can enable a connection of one same element 105, even if it is preferred that they serve to electrically connect the distinct elements 105.

Unless it is explicitly disposed otherwise in the present description, each feature of an embodiment described above can be implemented, mutatis mutandis, in the other embodiments. For example, rods 116 with several sections can be made in all the situations, likewise the different rod 116 transverse section shapes presented. Likewise, different variants of an electrically conductive or insulating nature have been presented for the rods and the anchoring portions and, at each time that this is possible, all the combinations achievable from these electrical natures can be implemented.

Besides, several materials, preferably of an identical electrical (conductive or dielectric) nature, can be implemented to form the parts of the connection member 130. For example, an anchoring portion 131 can comprise a stack of layers of different materials, like a semi-conductive oxide followed by a semi-conductive nitride, or conversely.

According to an option, when a rod comprises several sections, they can be of different electrical nature, even if their configuration relative to the anchoring portion enables, despite everything, an electrical continuity from the element 105 to the surface of the projecting portion 1162. Alternatively, or in combination, with this case, the anchoring portion can comprise, in a stack, sublayers of a different electrical nature, even if their configuration relative to the rod always enables this electrical continuity.

The invention is not limited to the embodiments described above.

The invention claimed is:

1. A system comprising:
    a microelectronic device comprising a substrate exposed on a face of the device, the substrate comprising at least one electrically conductive element, and an electrical connection member in electrical continuity with the element and comprising at least one rod projecting over the face of the device,
    and a complementary microelectronic device comprising at least one complementary electrically conductive element and a terminal which is electrically connected to the complementary element and which is exposed on a face of the complementary device,
    wherein the electrical connection member comprises an inorganic anchoring portion covering the at least one electrically conductive element and in that the at least one rod comprises a buried portion buried in the inorganic anchoring portion followed by a projecting portion projecting over the face of the device, the projecting portion of the at least one rod being inserted in the terminal, and
    wherein the projecting portion of the at least one rod has a greater length than a length of the buried portion.

2. The system according to claim 1, wherein the buried portion forms at least 5% of a height of the at least one rod.

3. The system according to claim 1, wherein the buried portion forms at most 20% of a height of the at least one rod.

4. The system according to claim 1, wherein the dimension by height of the at least one rod is greater than 1 μm and/or less than 3 μm.

5. The system according to claim 1, wherein the at least one rod has a shape ratio, between its largest dimension in its transverse section and its dimension by height, greater than 20%.

6. The system according to claim 1, wherein the projecting portion of the at least one rod is greater than 300 nm.

7. The system according to claim 1, wherein the inorganic anchoring portion fully covers an upper face of the at least one electrically conductive element.

8. The system according to claim 1, wherein the at least one rod comprises a first end in contact with the at least one electrically conductive element.

9. The system according to claim 8, wherein the at least one rod is electrically conductive.

10. The system according to claim 9, wherein the inorganic anchoring portion (131) is electrically insulating.

11. The system according to claim 10, wherein the inorganic anchoring portion is made of silicon dioxide.

12. The system according to claim 1, wherein the inorganic anchoring portion is electrically conductive.

13. The system according to claim 12, wherein the at least one rod is electrically insulating, and wherein the connection member comprises an electrically conductive coating in contact both with the projecting portion of the at least one rod and of the inorganic anchoring portion.

14. The system according to claim 13, wherein the coating fully covers the projecting portion.

15. The system according to claim 1, wherein the at least one rod comprises at least one first section and one second section following one another along its dimension by height, the first section having a section transversal to the dimension by height greater than that of the second section.

16. A method for manufacturing a system comprising a microelectronic device comprising a substrate exposed on a face of the microelectronic device, the substrate comprising at least one electrically conductive element, and an electrical connection member in electrical continuity with the at least one electrically conductive element and comprising at least one rod projecting over the face of the microelectronic device, the method comprising:

covering the at least one electrically conductive element by an inorganic anchoring portion and forming a via with a first end and a second end opposite the first end, the via passing through the inorganic anchoring portion, such that the second end is flush with the surface of the inorganic anchoring portion;

partially removing the inorganic anchoring portion to remove some of the thickness of the inorganic anchoring portion by leaving a residual part of the inorganic anchoring portion, the via thus forming the at least one rod with a part of the via removed relative to the residual inorganic anchoring portion to form a projecting portion and a part of the via preserved in the residual inorganic anchoring portion to form a buried portion; and electrically connecting the microelectronic device with a complementary microelectronic device comprising at least one complementary electrically conductive element and a terminal which is electrically connected to the complementary element and which is exposed on a face of the complementary device, the projecting portion of the at least one rod being inserted in the terminal.

17. The method according to claim 16, wherein the at least one rod is formed with at least one first section and one second section following one another along its dimension in height, the first section having a section transversal to the dimension by height greater than that of the second section.

18. The method according to claim 16, wherein the partial removal comprises an etching of the inorganic anchoring portion.

19. The method according to claim 16, comprising a plasticising of the terminal when the projecting portion of the at least one rod is inserted.

20. A method for manufacturing a system comprising a microelectronic device comprising a substrate exposed on a face of the microelectronic device, the substrate comprising at least one electrically conductive element, and an electrical connection member in electrical continuity with the at least one electrically conductive element and comprising at least one rod projecting over the face of the microelectronic device, the method comprising:

covering the at least one electrically conductive element by an inorganic anchoring portion and forming a via with a first end and a second end opposite the first end, the via passing through the inorganic anchoring portion, such that the second end is flush with the surface of the inorganic anchoring portion;

partially removing the inorganic anchoring portion to remove some of the thickness of the inorganic anchoring portion by leaving a residual part of the inorganic anchoring portion, the via thus forming the at least one rod with a part of the via removed relative to the residual inorganic anchoring portion to form a projecting portion and a part of the via preserved in the residual inorganic anchoring portion to form a buried portion; and electrically connecting the microelectronic device with a complementary microelectronic device comprising at least one complementary electrically conductive element and a terminal which is electrically connected to the complementary element and which is exposed on a face of the complementary device, the projecting portion of the at least one rod being inserted in the terminal, wherein the projecting portion of the at least one rod has a greater length than a length of the buried portion.

* * * * *